(12) United States Patent
Lo et al.

(10) Patent No.: US 11,860,404 B2
(45) Date of Patent: Jan. 2, 2024

(54) MANUFACTURING METHOD OF A REFLECTIVE DISPLAY

(71) Applicant: E Ink Holdings Inc., Hsinchu (TW)

(72) Inventors: Chang-Cheng Lo, Hsinchu (TW); Yue-Feng Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 18/181,578

(22) Filed: Mar. 10, 2023

(65) Prior Publication Data

US 2023/0215995 A1 Jul. 6, 2023

Related U.S. Application Data

(63) Continuation of application No. 17/070,915, filed on Oct. 14, 2020, now abandoned.

(30) Foreign Application Priority Data

Oct. 16, 2019 (TW) .................................. 108137175

(51) Int. Cl.
*F21V 8/00* (2006.01)
*H01L 33/58* (2010.01)

(52) U.S. Cl.
CPC ........... *G02B 6/0088* (2013.01); *G02B 6/004* (2013.01); *G02B 6/0055* (2013.01); *H01L 33/58* (2013.01); *H01L 2933/0083* (2013.01)

(58) Field of Classification Search
CPC ...................................................... G02B 6/00
See application file for complete search history.

(56) References Cited

U.S. PATENT DOCUMENTS

2016/0291238 A1* 10/2016 Tai ........................ G02B 6/0065
2016/0313494 A1* 10/2016 Hamilton ................ C03C 15/00
2017/0102497 A1* 4/2017 Pao ........................ G02B 6/005

* cited by examiner

*Primary Examiner* — Robert G Bachner
*Assistant Examiner* — Molly K Reida
(74) *Attorney, Agent, or Firm* — JCIPRNET

(57) ABSTRACT

A manufacturing method of a reflective display includes at least the following steps. A reflective display module having a display surface is provided. An adhesive is formed on the display surface of the reflective display module. A plurality of microstructures is formed on the adhesive. A cover plate is provided over the reflective display module, the microstructures, and the adhesive. The cover plate has a first surface, a second surface, and a third surface. The second surface is located between the first surface and the reflective display module, and the third surface is connected to the first surface and the second surface. The second surface of the cover plate is adhered to the adhesive having the microstructures thereon to bond the microstructures onto the second surface of the cover plate. A light source is disposed adjacent to the third surface of the cover plate.

10 Claims, 5 Drawing Sheets

MANUFACTURING METHOD OF A REFLECTIVE DISPLAY

CROSS-REFERENCE TO RELATED APPLICATION

This application is a continuation application of and claims the priority benefit of U.S. application Ser. No. 17/070,915, filed on Oct. 14, 2020, now pending, which claims the priority benefit of Taiwan application serial no. 108137175, filed on Oct. 16, 2019. The entirety of each of the above-mentioned patent applications is hereby incorporated by reference herein and made a part of this specification.

BACKGROUND OF THE INVENTION

Field of the Invention

The invention relates to a display, and more particularly to a reflective display.

Description of Related Art

A reflective display using ambient light as a light source readily causes insufficient brightness of the display screen due to insufficient ambient light. In order to improve the above issue, a technique has been proposed to provide a light source module above the reflective display module. However, the more layers that are stacked above the reflective display module, the thicker the reflective display, and the contrast of the reflective display is affected as a result.

SUMMARY OF THE INVENTION

The invention provides a reflective display that may have advantages such as being thin and light and having good contrast.

A reflective display of the invention includes a reflective display module, a cover plate, a light source, a plurality of microstructures, and an adhesive. The reflective display module has a display surface. The cover plate is overlapped with the reflective display module, and the display surface of the reflective display module is located between the cover plate and the reflective display module. The cover plate has a first surface, a second surface, and a third surface. The second surface is located between the first surface and the reflective display module. The third surface is connected to the first surface and the second surface. The light source is disposed beside the third surface of the cover plate. The plurality of microstructures are located between the cover plate and the reflective display module. The adhesive is located between the plurality of microstructures and the reflective display module. The reflective display module is bonded to the second surface of the cover plate via the adhesive.

In an embodiment of the invention, the reflective display module includes an electronic ink film.

In an embodiment of the invention, the third surface of the cover plate includes a first connecting surface, a second connecting surface, and a third connecting surface. The first connecting surface is connected to the first surface and the second connecting surface. The third connecting surface is connected to the second surface and the second connecting surface. The light source is overlapped with the second connecting surface and is located beside the third connecting surface.

In an embodiment of the invention, the light source includes a light strip.

In an embodiment of the invention, a plurality of microstructures are disposed on the adhesive, and the plurality of microstructures are bonded to the second surface of the cover plate via the adhesive.

In an embodiment of the invention, the plurality of microstructures are disposed on the second surface, and the reflective display module is bonded to the second surface of the cover plate and the plurality of microstructures via the adhesive.

In an embodiment of the invention, a distribution density of the plurality of microstructures is increased in a direction away from the light source.

A reflective display of the invention includes a reflective display module, a cover plate, a light source, and an adhesive. The reflective display module has a display surface. The cover plate is overlapped with the reflective display module, and the display surface of the reflective display module is located between the cover plate and the reflective display module. The cover plate has a first surface, a second surface, and a third surface. The second surface is located between the first surface and the reflective display module. The third surface is connected to the first surface and the second surface. The light source is disposed on the second surface of the cover plate. The adhesive is located between the light source and the reflective display module. The reflective display module is bonded to the light source via the adhesive.

In an embodiment of the invention, the light source includes a plurality of micro light-emitting diodes.

In an embodiment of the invention, the reflective display further includes an anti-glare film. The anti-glare film is disposed on the first surface of the cover plate.

Based on the above, in an embodiment of the invention, the light source is disposed on the side of the cover plate or under the cover plate. By omitting the light guide plate and the adhesive for bonding the light guide plate and the protective cover, the number of layers stacked above the reflective display module is reduced, such that the thickness of the reflective display is reduced and the contrast of the reflective display is improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
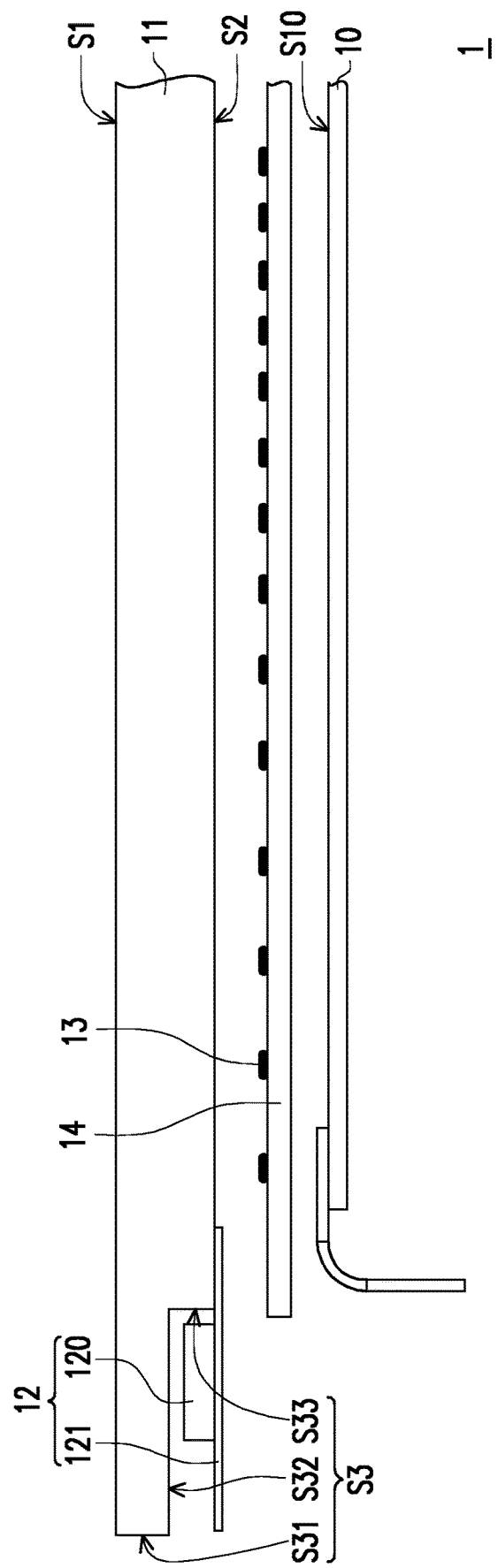
FIG. 1 is a partial cross-sectional exploded view of a reflective display according to the first embodiment of the invention.

In the present specification, wordings used to indicate direction, such as "up," "down," "front," "back," "left," and "right", merely refer to directions in the drawings. Therefore, the directional terms are used to illustrate and are not intended to limit the invention.

In the drawings, the figures depict typical features of the methods, structures, and/or materials used in the particular embodiments. However, the figures are not to be interpreted as defining or limiting the scope or nature of the embodiments. For example, the relative size, thickness, and location of layers, regions, and/or structures may be reduced or enlarged for clarity.

In the following embodiments, the same or similar elements are designated by the same or similar reference numerals, and the description thereof is omitted. In addition, the features in different embodiments may be combined with each other without conflict, and simple equivalent changes and modifications made by the present specification or the claims are still within the scope of this patent.

Terms such as "first" and "second" as used in this specification or the claims are used to identify discrete elements or to distinguish different embodiments or ranges, and are not intended to limit the upper limit or the lower limit of the number of elements and are also not intended to limit the order of manufacture or the order of arrangement of the elements. Furthermore, the arrangement of one element/layer on (or above) another element/layer may include the case in which the element/layer is disposed directly on (or above) the other element/layer and the two elements/layers are in direct contact; and the case in which the element/layer is disposed indirectly on (or above) the other element/layer and one or a plurality of elements/layers are present between the two elements/layers.

Figure 2:
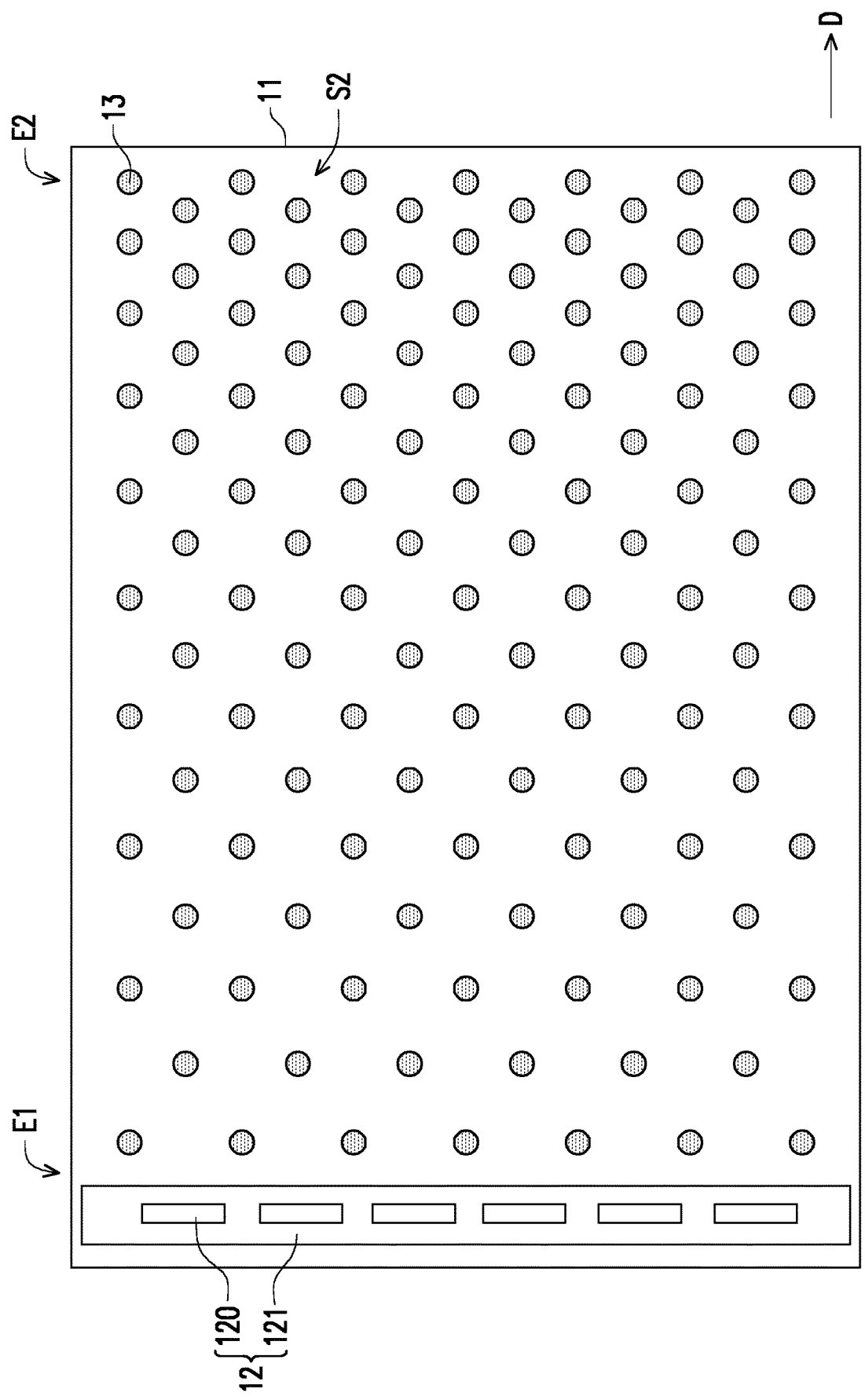
FIG. 2 is a top view of a cover plate, a light source, and a plurality of microstructures in FIG. 1.

FIG. 1 is a partial cross-sectional exploded view of a reflective display 1 according to the first embodiment of the invention. FIG. 2 is a top view of a cover plate 11, a light source 12, and a plurality of microstructures 13 in FIG. 1.

Referring to FIG. 1 and FIG. 2, the reflective display 1 includes a reflective display module 10, the cover plate 11, the light source 12, the plurality of microstructures 13, and an adhesive 14.

The reflective display module 10 has a display surface S10. The display surface S10 is a surface on which the reflective display module 10 provides an image screen. For example, reflective display module 10 may include an electronic ink film or other types of reflective display panels.

The cover plate 11 is overlapped with the reflective display module 10, and the display surface S10 of the reflective display module 10 is located between the cover plate 11 and the reflective display module 10. The cover plate 11 may be used as a protective cover for protecting the reflective display module 10. In order to avoid obscuring the image screen, the cover plate 11 is made of a light-transmitting material. For example, the material of the cover plate 11 may include glass and plastic, but is not limited thereto.

The cover plate 11 has a first surface S1, a second surface S2, and a third surface S3. The second surface S2 is located between the first surface S1 and the reflective display module 10, and the third surface S3 is connected to the first surface S1 and the second surface S2. In other words, the second surface S2 is a surface of the cover plate 11 facing the reflective display module 10, the first surface S1 is a surface opposite to the second surface S2, and the third surface S3 is a side surface of the cover plate 11.

In addition to being used as a protective cover, the cover plate 11 may also be used as a light guide plate for transmitting a light beam. Specifically, the light source 12 is disposed adjacent to the third surface S3 of the cover plate 11, and the light source 12 is adapted to output an illumination beam (not shown) toward the third surface S3 of the cover plate 11. For example, the light source 12 may include a light strip formed by a plurality of light-emitting elements 120 and a circuit board 121. The plurality of light-emitting elements 120 are disposed on the circuit board 121 and electrically connected to the circuit board 121. FIG. 2 schematically shows six light-emitting elements 120, and the six light-emitting elements 120 are arranged along the edge of the cover plate 11. However, the number of the plurality of light-emitting elements 120 and the arrangement method thereof may vary as desired, and are not limited to those shown in FIG. 2. The light-emitting elements 120 may be light-emitting diodes, but are not limited thereto. The circuit board 121 may be a printed circuit board or a flexible printed circuit board, but is not limited thereto.

According to different requirements, the third surface S3 of the cover plate 11 may be a combination of a longitudinal surface, a slope, a curved surface, a zigzag surface, or at least two surfaces above connected between the first surface S1 and the second surface S2. In the present embodiment of the invention, the third surface S3 of the cover plate 11 includes a first connecting surface S31, a second connecting surface S32, and a third connecting surface S33. The first connecting surface S31 is connected to the first surface S1 and the second connecting surface S32. The third connecting surface S33 is connected to the second surface S2 and the second connecting surface S32. The first connecting surface S31 and the third connecting surface S33 are, for example, perpendicular to the longitudinal surfaces of the first surface S1 and the second surface S2, and the second connecting surface S32 is, for example, perpendicular to the planes of the first connecting surface S31 and the third connecting surface S33, but the invention is not limited thereto.

The light source 12 is overlapped with the second connecting surface S32 and is located beside the third connecting surface S33. Further, the second connecting surface S32 is recessed into the cover plate 11 with respect to the second surface S2 to form a space in which the plurality of light-emitting elements 120 may be disposed. The illumination beam from the light source 12 may enter the cover plate 11 via the third connecting surface S33 and be transmitted from a near light source side E1 of the cover plate 11 to a far light source side E2 of the cover plate 11 via total internal reflection (TIR).

The plurality of microstructures 13 are located between the cover plate 11 and the reflective display module 10. The plurality of microstructures 13 are adapted to destroy TIR such that the light beam is outputted from the first surface S1 of the cover plate 11. For example, the microstructures 13 may be mesh points, but are not limited thereto.

The adhesive 14 is located between the plurality of microstructures 13 and the reflective display module 10, and the reflective display module 10 is bonded to the second surface S2 of the cover plate 11 via the adhesive 14. In order to avoid obscuring the display screen, the adhesive 14 may be formed by curing a light-transmitting adhesive material. For example, the adhesive 14 may include an optically clear adhesive (OCA), but is not limited thereto.

In the present embodiment, as shown in FIG. 1, the plurality of microstructures 13 may be disposed on the adhesive 14, such as formed on the adhesive 14 via an ink printing method, and the plurality of microstructures 13 may be bonded to the second surface S2 of the cover plate 11 via the adhesive 14. However, the arrangement positions of the plurality of microstructures 13 may be changed as needed, and are not limited to those shown in FIG. 1. Further, as shown in FIG. 2, the distribution density of the plurality of microstructures 13 may be increased toward a direction D away from the light source 12 to increase the output ratio of the light beam on the far light source side. Thereby, the brightness and color of the image screen are more uniform/consistent on the near light source side E1 and the far light source side E2.

In the reflective display 1 of the present embodiment, the cover plate 11 is used as a protective cover and a light guide plate, as compared with a reflective display module provided with a light guide plate, a protective cover, and an adhesive for bonding the light guide plate and the protective cover. Therefore, the light guide plate and the adhesive for bonding the light guide plate and the protective cover may be omitted. Since the number of layers stacked above the reflective display module may be reduced, in addition to reducing the cost of the reflective display 1, the thickness may be reduced and the contrast may be improved. Accordingly, the reflective display 1 may have advantages such as being thin and light and having good contrast.

Figure 3:
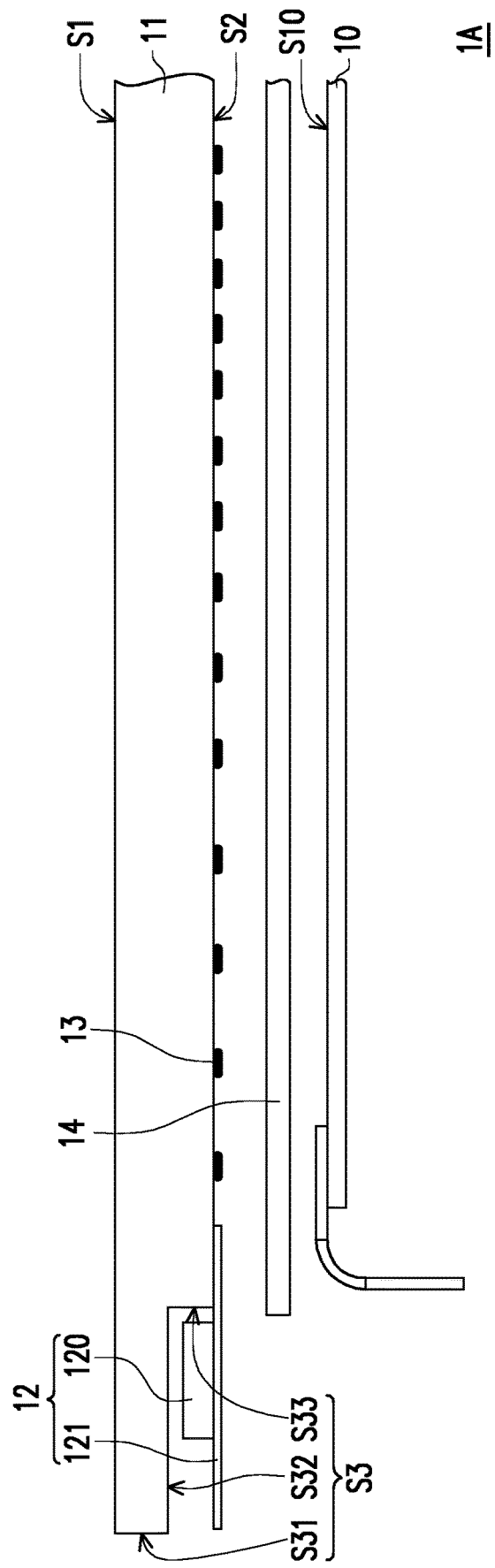
FIG. 3 is a partial cross-sectional exploded view of a reflective display according to the second embodiment of the invention.

FIG. 3 is a partial cross-sectional exploded view of a reflective display 1A according to the second embodiment of the invention. Referring to FIG. 3, the main differences between the reflective display 1A and the reflective display 1 of FIG. 1 are as follows.

In the reflective display 1 of FIG. 1, the plurality of microstructures 13 are disposed on the adhesive 14, and the plurality of microstructures 13 are bonded to the second surface S2 of the cover plate 11 via the adhesive 14. In other words, the plurality of microstructures 13 are bonded to the second surface S2 of the cover plate 11 during the bonding process of the reflective display module 10 and the cover plate 11. Moreover, in the reflective display 1A, the plurality of microstructures 13 are disposed on the second surface S2, and the reflective display module 10 is bonded to the second surface S2 of the cover plate 11 and the plurality of microstructures 13 via the adhesive 14. In other words, the plurality of microstructures 13 are formed on the second surface S2 of the cover plate 11 before the bonding step of the reflective display module 10 and the cover plate 11 is performed. In an embodiment, the plurality of microstructures 13 may be formed on the second surface S2 of the cover plate 11 via an ink printing method.

Figure 4:
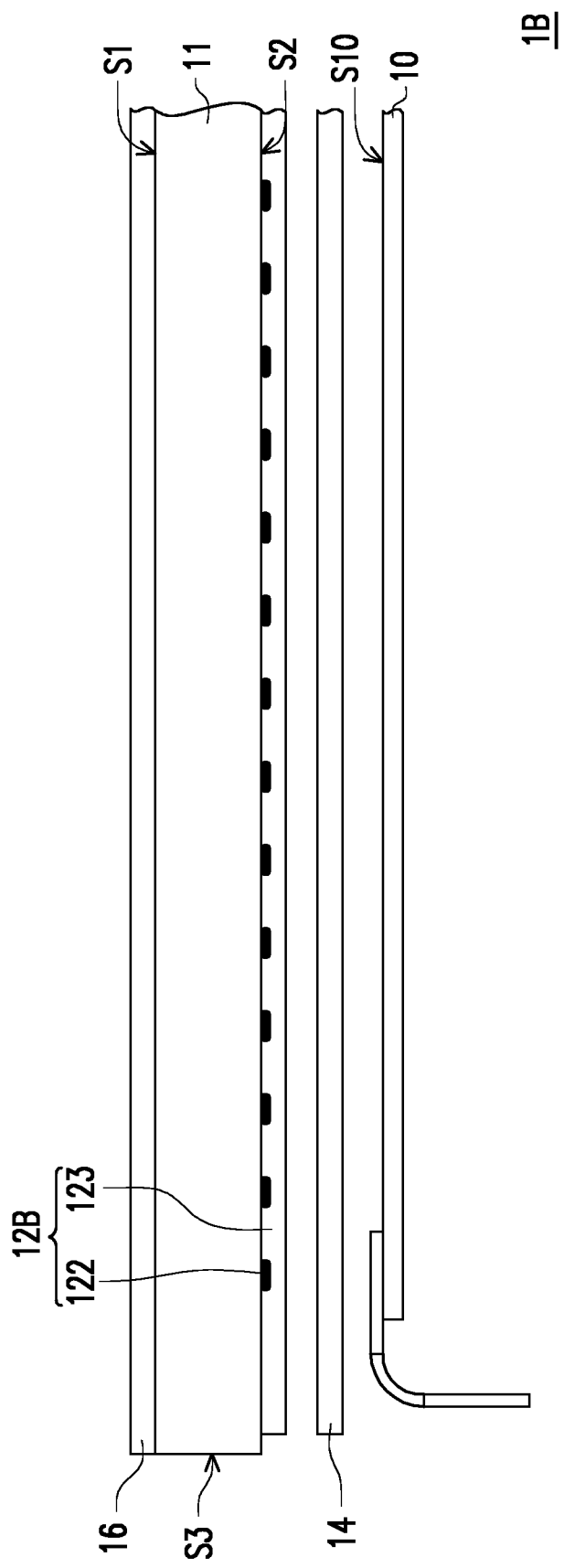
FIG. 4 is a partial cross-sectional exploded view of a reflective display according to the third embodiment of the invention.
Figure 5:
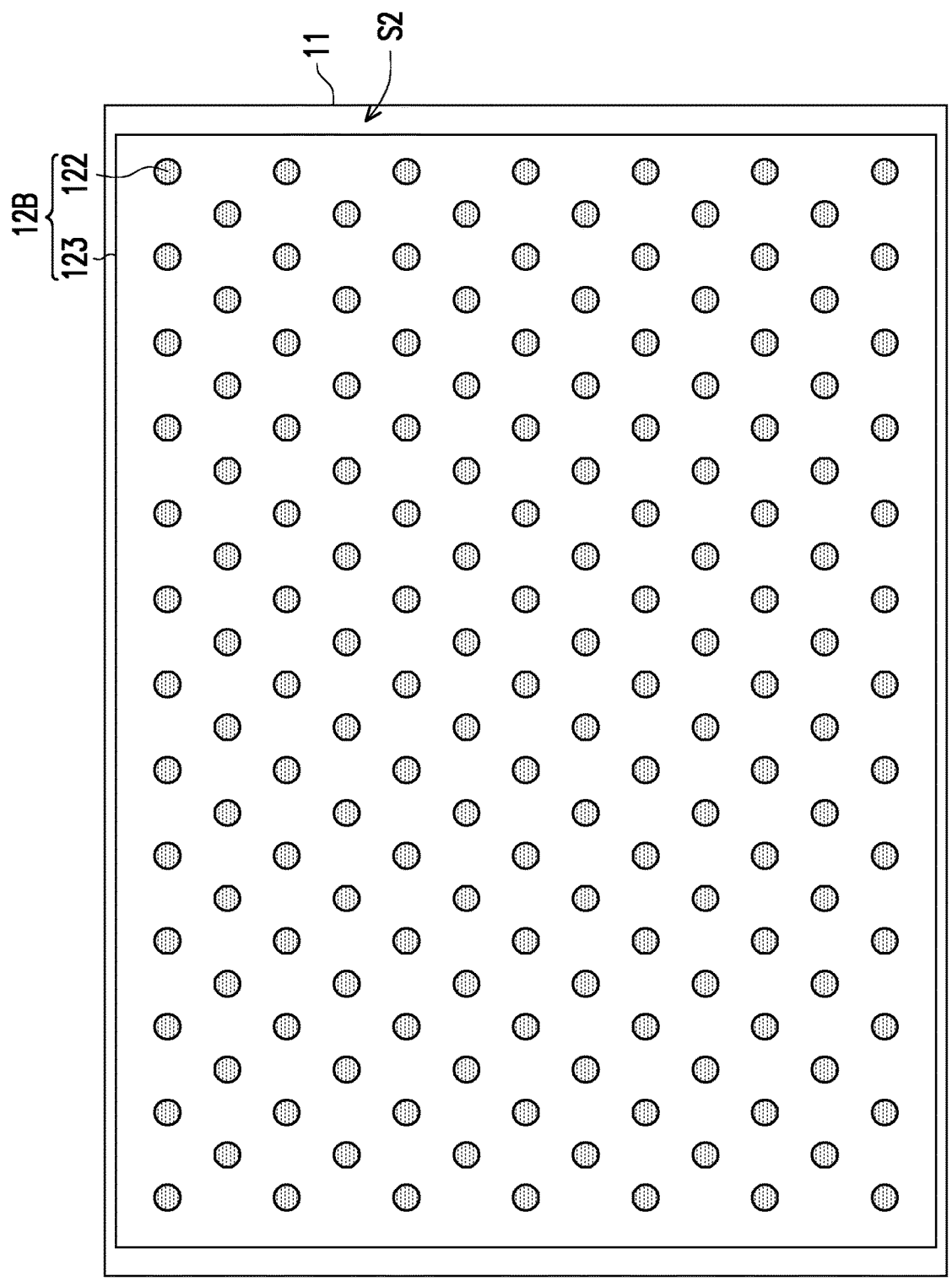
FIG. 5 is a top view of a cover plate and a light source in FIG. 4.

FIG. 4 is a partial cross-sectional exploded view of a reflective display 1B according to the third embodiment of the invention. FIG. 5 is a top view of the cover plate 11 and the light source 12 in FIG. 4. Referring to FIG. 4 and FIG. 5, the main differences between the reflective display 1B and the reflective display 1 of FIG. 1 are as follows.

The reflective display 1B includes the reflective display module 10, the cover plate 11, a light source 12B, and the adhesive 14, but does not include the plurality of microstructures 13 of FIG. 1. Further, the light source 12B is disposed on the second surface S2 of the cover plate 11. The adhesive 14 is located between the light source 12B and the reflective display module 10, and the reflective display module 10 is bonded to the light source 12B via the adhesive 14.

The light source 12B may include a plurality of light-emitting elements 122 and a light-transmitting conductive substrate 123. The plurality of light-emitting elements 122 are electrically connected to the light-transmitting conductive substrate 123, and the plurality of light-emitting elements 122 may be fixed on the second surface S2 of the cover plate 11 via the light-transmitting conductive substrate 123. The plurality of light-emitting elements 122 may be uniformly disposed on the second surface S2 of the cover plate 11 with a distance between two adjacent light-emitting elements 122 to enable a light beam to pass between the two adjacent light-emitting elements 122. FIG. 5 schematically shows one of the arrangement methods of the plurality of light-emitting elements 122, but the arrangement method of the plurality of light-emitting elements 122 is not limited thereto. The plurality of light-emitting elements 122 may be a plurality of micro light-emitting diodes 122 or other micro light-emitting elements to reduce the visibility of the light-emitting elements 122. The light-transmitting conductive substrate 123 may be a conductive glass, such as indium tin oxide (ITO) glass, but is not limited thereto.

As shown in FIG. 4, the reflective display 1B may further include other elements depending on various needs. For example, the reflective display 1B may further include an anti-glare film 16. The anti-glare film 16 is disposed on the first surface S1 of the cover plate 11 to achieve an anti-glare effect.

Under the architecture in which the light-emitting surfaces (not labeled) of the light-emitting elements 122 face the second surface S2 of the cover plate 11, the illumination beam from the light-emitting elements 122 may be diverted via the reflection of the first surface S1 (or the anti-glare film 16). The diverted illumination beam sequentially passes through the cover plate 11, the light-transmitting conductive substrate 123, and the adhesive 14 and then is transmitted to the reflective display module 10. The reflective display module 10 converts the illumination beam into a display beam and reflects the display beam. The reflected display beam sequentially passes through the adhesive 14, the light-transmitting conductive substrate 123, the cover plate 11, and the anti-glare film 16 and is emitted from the reflective display 1B. Moreover, under the architecture in which the light-emitting surfaces of the light-emitting elements 122 face the reflective display module 10, the illumination beam from the light-emitting elements 122 sequentially passes through the light-transmitting conductive substrate 123 and the adhesive 14 and is transmitted to the reflective display module 10. The reflective display module 10 converts the illumination beam into a display beam and reflects the display beam. The reflected display beam sequentially passes through the adhesive 14, the light-transmitting conductive substrate 123, the cover plate 11, and the anti-glare film 16 and is emitted from the reflective display 1B.

Based on the above, in an embodiment of the invention, the light source is disposed on the side of the cover plate or under the cover plate. By omitting the light guide plate and the adhesive for bonding the light guide plate and the protective cover, the number of layers stacked above the reflective display module is reduced, such that the thickness of the reflective display is reduced and the contrast of the reflective display is improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a reflective display, comprising:
   providing a reflective display module having a display surface;
   forming an adhesive on the display surface of the reflective display module;
   forming a plurality of microstructures on the adhesive;
   providing a cover plate over the reflective display module, the plurality of microstructures, and the adhesive, wherein the cover plate has a first surface, a second surface, and a third surface, the second surface is located between the first surface and the reflective display module, and the third surface is connected to the first surface and the second surface;
   adhering the second surface of the cover plate to the adhesive having the plurality of microstructures thereon to bond the plurality of microstructures onto the second surface of the cover plate; and
   disposing a light source adjacent to the third surface of the cover plate.

2. The manufacturing method of the reflective display according to claim 1, wherein forming the plurality of microstructures on the adhesive precedes adhering the second surface of the cover plate to the adhesive.

3. The manufacturing method of the reflective display according to claim 1, wherein the reflective display module comprises an electronic ink film.

4. The manufacturing method of the reflective display according to claim 1, wherein the third surface of the cover plate comprises a first connecting surface, a second connecting surface, and a third connecting surface, the first connecting surface is connected to the first surface and the second connecting surface, the third connecting surface is connected to the second surface and the second connecting surface, and the light source is overlapped with the second connecting surface and is located beside the third connecting surface.

5. The manufacturing method of the reflective display according to claim 1, wherein the light source comprises a light strip.

6. The manufacturing method of the reflective display according to claim 1, wherein the plurality of microstructures are formed on the adhesive via an ink printing method.

7. The manufacturing method of the reflective display according to claim 1, wherein a distribution density of the plurality of microstructures is increased in a direction away from the light source.

8. The manufacturing method of the reflective display according to claim 1, further comprising disposing an antiglare film on the first surface of the cover plate.

9. The manufacturing method of the reflective display according to claim 1, wherein disposing the light source adjacent to the third surface of the cover plate comprises:
   providing a circuit board;
   disposing a plurality of light-emitting elements on the circuit board;
   placing the plurality of light-emitting elements adjacent to the third surface of the cover plate and placing at least a portion of the circuit board on the second surface of the cover plate; and
   fixing the portion of the circuit board on the second surface of the cover plate through the adhesive.

10. The manufacturing method of the reflective display according to claim 9, wherein the plurality of the microstructures and the portion of the circuit board are bonded to the second surface of the cover plate simultaneously during a same step.

* * * * *